(12) United States Patent
Briggs et al.

(10) Patent No.: US 9,824,982 B1
(45) Date of Patent: Nov. 21, 2017

(54) STRUCTURE AND FABRICATION METHOD FOR ENHANCED MECHANICAL STRENGTH CRACK STOP

(71) Applicant: International Business Machines Corporation, Armonk, NY (US)

(72) Inventors: Benjamin D. Briggs, Waterford, NY (US); Lawrence A. Clevenger, Rhinebeck, NY (US); Bartlet H. DeProspo, Goshen, NY (US); Huai Huang, Clifton Park, NY (US); Christopher J. Penny, Saratoga Springs, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/232,211

(22) Filed: Aug. 9, 2016

(51) Int. Cl.
| | |
|---|---|
| *H01L 21/4763* | (2006.01) |
| *H01L 23/00* | (2006.01) |
| *H01L 23/522* | (2006.01) |
| *H01L 23/528* | (2006.01) |
| *H01L 23/532* | (2006.01) |
| *H01L 21/768* | (2006.01) |

(52) U.S. Cl.
CPC ...... *H01L 23/562* (2013.01); *H01L 21/76816* (2013.01); *H01L 21/76828* (2013.01); *H01L 21/76843* (2013.01); *H01L 21/76877* (2013.01); *H01L 23/528* (2013.01); *H01L 23/5226* (2013.01); *H01L 23/5329* (2013.01)

(58) Field of Classification Search
CPC ........................... H01L 21/00; H01L 2221/00
See application file for complete search history.

(56) References Cited

U.S. PATENT DOCUMENTS

| | | |
|---|---|---|
| 6,933,586 B2 | 8/2005 | Fornof et al. |
| 7,087,982 B2 | 8/2006 | Huang et al. |
| 7,109,093 B2 | 9/2006 | Fitzsimmons et al. |
| 7,572,738 B2 | 8/2009 | Nogami |
| 7,871,902 B2 | 1/2011 | Kaltalioglu et al. |
| 8,062,983 B1 | 11/2011 | Draeger et al. |
| 8,125,054 B2 | 2/2012 | West et al. |
| 8,716,101 B2 | 5/2014 | Chandra et al. |
| 2005/0208781 A1* | 9/2005 | Fitzsimmons .......... H01L 21/78 438/800 |

(Continued)

OTHER PUBLICATIONS

Notice of Allowance dated Oct. 12, 2017 received in U.S. Appl. No. 15/684,494.

*Primary Examiner* — Charles Garber
*Assistant Examiner* — Abdulfattah Mustapha
(74) *Attorney, Agent, or Firm* — Scully, Scott, Murphy & Presser, P.C.

(57) ABSTRACT

Methods for enhancing mechanical strength of back-end-of-line (BEOL) dielectrics to prevent crack propagation within interconnect stacks are provided. After forming interconnect structures in a dielectric material layer, a pore filling material is introduced into pores of a portion of the dielectric material layer that is located in a crack stop region present around a periphery of a chip region. By filling the pores of the portion of the dielectric material layer located in the crack stop region, the mechanical strength of the dielectric material layer is selectively enhanced in the crack stop region.

11 Claims, 3 Drawing Sheets

(56) References Cited

U.S. PATENT DOCUMENTS

| | | |
|---|---|---|
| 2006/0264035 A1* | 11/2006 | Nogami ............ H01L 21/76801 438/638 |
| 2006/0281295 A1* | 12/2006 | Naujok ............... H01L 21/7682 438/618 |
| 2009/0081862 A1 | 3/2009 | Chen et al. |
| 2013/0171817 A1 | 7/2013 | Cooney, III et al. |
| 2014/0217539 A1 | 8/2014 | Rantala |
| 2014/0248745 A1 | 9/2014 | Wu et al. |
| 2016/0056071 A1 | 2/2016 | Draeger et al. |

* cited by examiner

STRUCTURE AND FABRICATION METHOD FOR ENHANCED MECHANICAL STRENGTH CRACK STOP

BACKGROUND

The present application relates to an integrated circuit (IC) chip, and more particularly, to methods for improving mechanical strength of back-end-of-line (BEOL) dielectrics to prevent crack propagation within interconnect stacks.

Integrated circuits are generally created by forming an array of electronic devices (i.e., transistors, diodes, resistors, capacitors, etc.) and interconnect wiring structures on a semiconductor substrate. Generally, semiconductor devices and gates are formed in a first layer during front-end-of-line (FEOL) processing, followed by formation of interconnect wiring structures in a second layer by BEOL processes. These first and second layers can each contain multiple layers of dielectric material which electrically isolate the devices and interconnect structures. Advanced semiconductor processes utilize dielectric materials with low dielectric constants (low-k) to minimize interconnect parasitic capacitances.

After a plurality of integrated circuits (ICs) are formed on a semiconductor wafer, the semiconductor wafer is subjected to a wafer cutting process so as to divide the semiconductor wafer into a plurality of semiconductor chips. The semiconductor chip is then bonded to a substrate package. Due to poor mechanical strength of the low-k dielectric materials during the wafer cutting and bonding processes, cracks can form and propagate through the BEOL dielectrics toward the active area of the IC chip, causing chip failure. There thus exists a need to enhance mechanical strength of the BEOL dielectrics.

SUMMARY

The present application provides methods for enhancing mechanical strength of BEOL dielectrics to prevent crack propagation within interconnect stacks. After forming interconnect structures in a dielectric material layer, a pore filling material is introduced into pores of a portion of the dielectric material layer that is located in a crack stop region present around a periphery of a chip region. By filling the pores of the portion of the dielectric material layer located in the crack stop region, the mechanical strength of the dielectric material layer is selectively enhanced in the crack stop region. The crack propagation can thus be effectively prevented in the crack stop region.

In one aspect of the present application, a semiconductor structure is provided. The semiconductor structure includes a plurality of interconnect structures embedded in a dielectric material layer located over a substrate. The plurality of interconnect structures includes a first set of interconnect structures located in a chip region and a second set of interconnect structures located in a crack stop region around a periphery of the chip region. A pore filling material fills at least some pores in a portion of the dielectric material layer located in the crack stop region.

In another aspect of the present application, a method for forming a semiconductor structure is provided. The method includes forming a plurality of interconnect structures embedded in a dielectric material layer located over a substrate. The plurality of the interconnect structures includes a first set of interconnect structures located in a chip region and a second set of interconnect structures located in a crack stop region around a periphery of the chip region. At least some pores in a portion of the dielectric material layer located in the crack stop region is then filled with a pore filling material.

DETAILED DESCRIPTION

Figure 1:
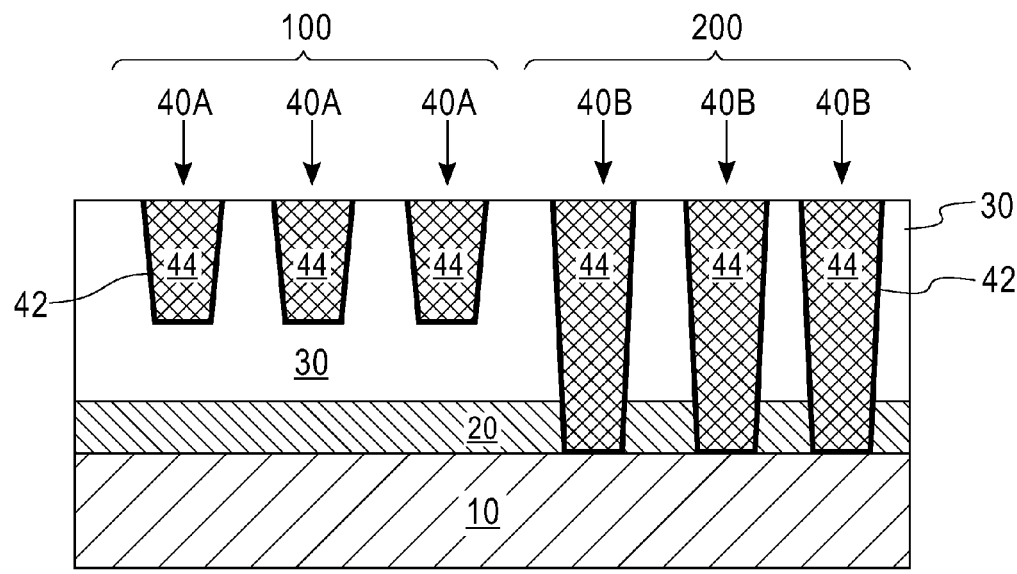
FIG. 1 is a cross-sectional view of a first exemplary semiconductor structure including a dielectric material layer and a plurality of interconnect structures located therein that can be employed in a first embodiment of the application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes interconnect structures formed within a dielectric material layer 30 that is located over a substrate 10. Optionally, a dielectric cap layer 20 may be formed between the substrate 10 and the dielectric material layer 30.

The semiconductor structure includes a chip region 100 and a crack stop region 200 formed around a periphery of the chip region 100. Active and passive devices such as, for example, transistors, diodes, resistors, inductors or other components that are part of integrated circuits can be fabricated in the chip region 100. The crack stop region 200 functions to reduce or prevent the propagation of cracks, which are initiated by chipping and cracking formed along peripheral edges of the chip during subsequent dicing and/or bonding operations, into the chip region 100.

The substrate 10 can include a semiconductor material, an insulator material, a conductive material, or a combination thereof. The semiconductor material can be an elemental semiconductor material such as silicon, germanium, carbon, or an alloy thereof, a III-V compound semiconductor material, a II-VI compound semiconductor material, or any combination or stack thereof. The semiconductor material can be doped with electrical dopants such as B, Ga, In, P, As, and Sb. Multiple semiconductor materials can be present in the substrate 10. The insulator material can be doped or undoped silicon oxide, doped derivatives of silicon oxide, silicon nitride, silicon oxynitride, or a combination or stack thereof. Multiple insulator materials can be present in the substrate 10. The conductive material can include a metallic material such as Cu, W, Ti, Ta, Al, WN, TiN, TaN, WC, TiC, or alloys thereof. Further, the substrate 10 can include a contact-level dielectric material layer and contact via structures embedded therein.

When present, the dielectric cap layer 20 can protect the underlying substrate 10 from impurities that may diffuse down from upper levels, and can function as a diffusion barrier layer that prevents vertical diffusion of metallic impurities, moisture, or other gaseous impurities. The dielectric cap layer 20 may include, for example, silicon nitride, silicon oxynitride, silicon carbide, nitrogen and hydrogen doped silicon carbide (SiCNH) or a combination thereof. The dielectric cap layer 20 may be formed, for example, by chemical vapor deposition (CVD) or atomic layer deposition (ALD). The thickness of the dielectric cap layer 20 can be from 25 nm to 50 nm, although lesser and greater thicknesses can also be employed. The dielectric cap layer 20 is optional and can be omitted in some embodiments of the present application.

The dielectric material layer 30 typically includes a porous low-k dielectric material. By "low-k" it is meant a dielectric material having a dielectric constant that is about 4.0 or less. In one embodiment, the dielectric material layer 30 includes organosilicates, silsequioxanes, undoped silicate glass (USG), fluorosilicate glass (FSG), SiCOH or borophosphosilicate glass (BPSG). The dielectric material layer 30 may be formed by CVD, plasma enhanced chemical vapor deposition (PECVD) or spin coating. The thickness of the dielectric material layer 30 may be from 100 nm to 1,000 nm, although lesser and greater thicknesses can also be employed.

The interconnect structures include a first set of interconnect structures (herein referred to as first interconnect structures 40A) formed in the chip region 100 and a second set of interconnect structures (herein referred to as second interconnect structures 40B) formed in the crack stop region 200. The first interconnect structures 40A provide electric connections for electric components of the substrate 10 located in the chip region 100. The second interconnect structures 40B are dummy structures and function as crack stops due to the higher mechanical strength and configuration of the metals within the second interconnect structures 40B compared to the dielectric material that provides mechanical strength within the dielectric material layer 30. As used herein, "dummy structures" are elements that are not part of the active circuitry, thus they have no function in the active circuitry. Each of the first and second interconnect structures 40A, 40B includes a metal liner 42 and a metal portion 44 surrounded by the metal liner 42.

The interconnect structures 40A, 40B can be formed by first patterning the dielectric material layer 30, utilizing lithography and etching processes known in the art to provide interconnect openings (not shown) in the dielectric material layer 30. The interconnect openings thus may be line openings and/or via openings. Line openings are formed in the dielectric material layer 30, while via opening are formed through both the dielectric material layer 30 and the dielectric cap layer 20. For example, a photoresist layer (not shown) can be applied over the dielectric material layer 30 and lithographically patterned to form a pattern of openings therein. The openings overlie areas in which formation of the interconnect openings are desired. The pattern in the photoresist layer is transferred into the dielectric material layer 30, and in some cases, the dielectric cap layer 20 by an anisotropic etch to form the interconnect openings. The anisotropic etch can be a dry etch such as reactive ion etch (RIE), or a wet etch. After forming the interconnect openings, the remaining portions of the photoresist layer can be removed, for example, by ashing.

Next, a metal liner layer (not shown) is conformally deposited along sidewalls and bottom surfaces of the interconnect openings and over the top surface of the dielectric material layer 30. The metal liner layer may include Ti, Ta, Ni, Co, Pt, W, Ru, TiN, TaN, WN, WC, an alloy thereof or a stack thereof such as Ti/TiN and Ta/TaN. The metal liner layer may be formed by a conventional deposition process including, for example, CVD, PECVD, ALD, physical vapor deposition (PVD) or chemical solution deposition. The metal liner layer that is formed may have a thickness from 2 nm to 40 nm, although lesser and greater thicknesses can also be employed.

After lining the interconnect openings with the metal liner layer, a metal layer (not shown) is deposited over the metal liner layer to completely fill the interconnect openings. The metal layer may include, for example, W, Cu, Al, Co, Ru, Mo, Os, Ir, Rh or an alloy thereof. The metal layer may be formed by any suitable deposition method such as, for example, CVD, PVD or plating.

After deposition, portions of the metal layer and the metal liner layer that are located above the top surface of the dielectric layer 30 are removed by employing a planarization process, such as, for example, chemical mechanical planarization (CMP). Each remaining portion of the metal liner layer located along the sidewalls and a bottom of each interconnect opening constitutes the metal liner 42, while each remaining portion of the metal layer located within each interconnect opening constitutes the metal portion 44. The top surfaces of the metal liners 42 and the metal portions are coplanar with the top surface of the dielectric material layer 30.

Figure 2:
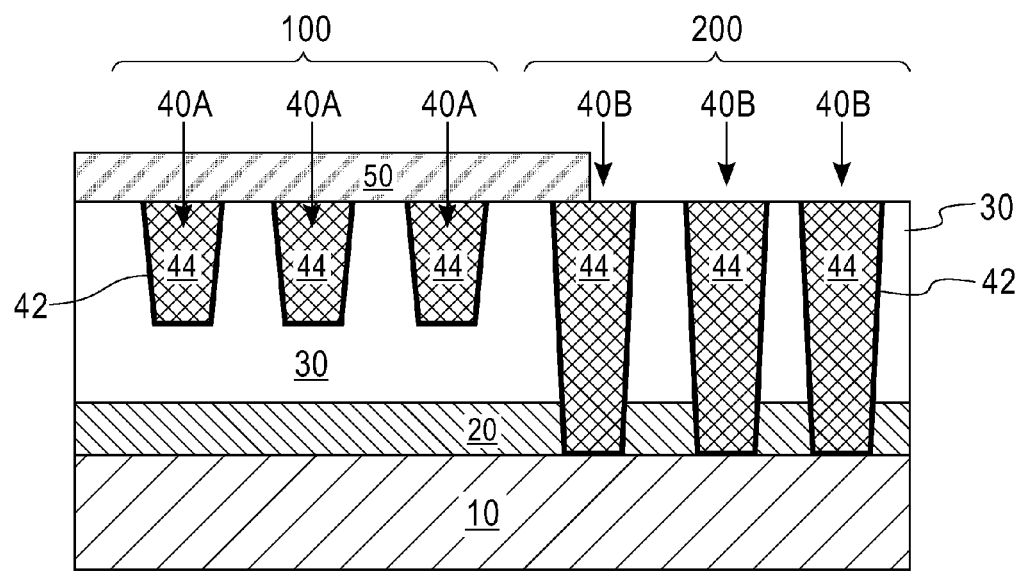
FIG. 2 is a cross-sectional view of the first exemplary semiconductor structure of FIG. 1 after forming a first mask layer portion covering a portion of the dielectric material layer and a first set of interconnect structures in a chip region, while exposing another portion of the dielectric material layer and a second set of interconnect structures in a crack stop region around a periphery of the chip region.

Referring to FIG. 2, a first mask layer portion 50 is formed over the dielectric material layer 30 to cover the chip region 100, while exposing the crack stop region 200. The first mask layer portion 50 can be formed by first applying a first mask layer (not shown) as a blanket layer over the entire top surface of the dielectric material layer 30. The first mask layer can be a photoresist layer or a photoresist layer in conjunction with a hardmask layer(s). The first mask layer is subsequently patterned by an anisotropic etch to provide the first mask layer portion 50 which is a remaining portion of the first mask layer. The anisotropic etch can be a dry etch such as, for example, RIE, or a wet etch that removes material(s) that provide the first mask layer selective to the dielectric material that provides the dielectric material layer 30 and metals that provide the metal liners 42 and the metal portions 44.

Figure 3:
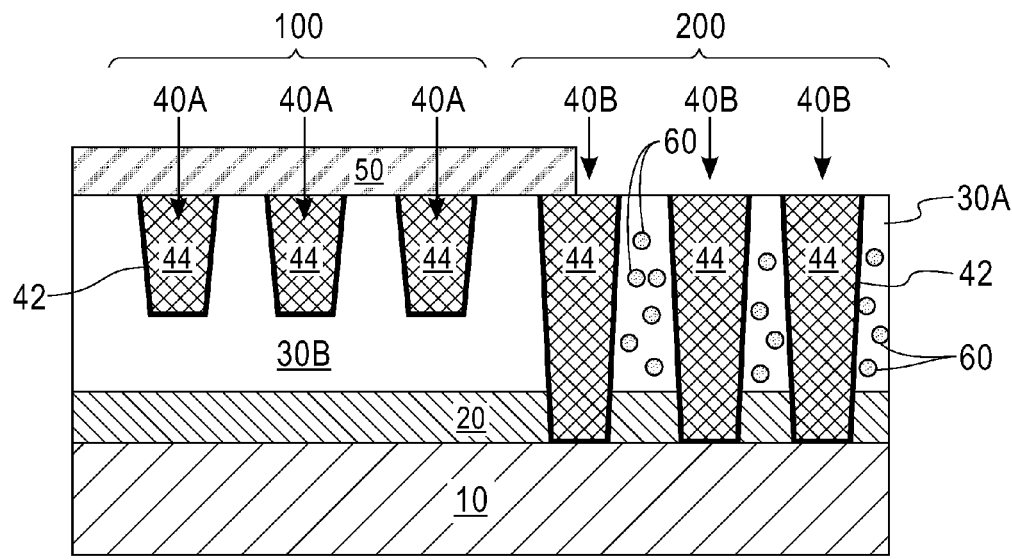
FIG. 3 is a cross-sectional view of the first exemplary semiconductor structure of FIG. 2 after filling pores of the exposed portion of the dielectric material layer in the crack stop region with a pore filling material.

Referring to FIG. 3, a pore filling material 60 is introduced into the physically exposed portion of the dielectric material layer 30 to fill pores in the exposed portion of the dielectric material layer 30. A filled dielectric material portion 30A with enhanced mechanical strength is thus formed in the crack stop region 200 to surround the second interconnect structures 40B. The portion of the dielectric material layer that is covered by the first mask layer portion 50 in the chip region 100 is herein referred to as the dielectric material portion 30b. It should be understood that with respect to this "filling" operation, not every pore is necessarily filled, nor are pores that are filled necessarily completely filled. That is, some pores may be completely filled, some pores may be partially filled, and some pores may not be filled at all so long as there is sufficient "filling" of the pores in the dielectric material layer 30 within the crack stop region 200 to provide the mechanical strength needed to prevent crack propagation. In one example, sufficient filling of the pores can be achieved when approximately 75% of the pores are filled with the pore filling material 60.

The pore filling material 60 may include a polymer that can be easily diffuse into pores in the dielectric material layer 30. In one embodiment, the pore filling material 60 may include a low molecular weight material, e.g., a polymer having a molecular weight between about 100 g/mol and about 5,000 g/mol. In another embodiment, the pore filling material 60 may include a polymer with a broader molecular weight range. For example, a polymer may be used whose molecular weight is in the range of 100 g/mol to 20,000,000 g/mol or more. The polymer may be a linear or branched polymer selected from the group of polyimides, polybenzoxazoles, polybenzimidazoles, poly(aniline), poly (phenylene sulfide), phenol-formaldehyde/cresol-formaldehyde resins, polystyrenes, polylactic acid, polyesters, poly (bisbenzocyclobutene), poly(divinylsiloxanebis-benzocyclobutene), poly(aromatics) such as SiLK™, polyamides, polyamide-imides, polyetherimides, polyphenylquinoxalines, poly(perfluoroethers), soluble, fluorinated polyalkanes, poly(acrylonitrile), polyetherketones, poly(vinylalcohol), poly(styrene-co-styrene sulfonic acid), poly (acrylic acid), poly(hydroxyethylmethacrylate), poly(vinyl imidizolium sulfobetaine), poly(vinyl pyridinium sulfobetaine), poly(amido amines), poly(styrene-butadiene-styrene) block copolymers, poly(butadiene), poly(isoprene), polysilazanes, polyureasilazane, poly(perhydrosilazane), poly(metal oxides) including metal from one or more of groups IV, XIII and XIV of the Periodic Table, silicates, titanates, aluminosilicates, aluminates, and zirconates. The polymer is preferably a linear polymer, a linear di- or tri-block copolymer, or a hyperbranched or a polymeric unimolecular amphiphile.

A layer of the pore filling material 60 is first applied over the top surface of the first mask layer portion 50, the top surface of the exposed portion of the dielectric material layer 30 and the top surfaces of the second interconnect structures 40B by, for example, spin coating. The pore filling material 60 is then allowed to diffuse into the pores of the exposed portion of the dielectric material layer 30. Depending on the pore filling material 60 used, the pore filling material 60 may diffuse into the pores at room temperature, or it may be necessary to heat the pore filling material to promote its flow into the pores. For example, the pore filling material 60 (e.g. a polymer) may be heated above its glass transition temperature ($T_g$) to allow it to flow into the pores. If heating is necessary, the temperature must remain below the decomposition temperature of the pore filling material 60. In one embodiment, the pore filling material 60 may be heated to a temperature in a range from 150° C. to 400° C. The temperature for the filling may depend, at least in part, on the nature (composition) of the porous material that provides the dielectric material layer 30. For example, if the surface of the porous material has a good affinity for the pore filling material 60, the penetration temperature will be lower since less energy is needed to drive the pore filling material 60 into the pores.

After diffusion, the excess pore filling material 60 that remains on top of the filled dielectric material portion 30A may be removed by a suitable method, such as, for example, plasma etch, RIE strip, wet dissolution or gentle polishing. Care should be exercised not to remove the pore filling material 60 from the filled pores in the structure. If not removed during the process employed to remove the excess pore filling material 60, the first mask layer portion 50 may be removed by oxygen-based or $N_2/H_2$-based plasma etch or it may be retained.

Subsequently, upper level metallization layers of a BEOL structure may be constructed by performing the processing steps described above in FIGS. 1-3.

In the present application, since no pore filling material 60 is introduced into the dielectric material portion 30B in the chip region 100, the first interconnect structures 40A in the chip region 100 remain surrounded by the pristine low-k dielectric material which is desirable for reducing the capacitance of the first interconnect structures 40A. By "pristine" it is meant, that the low k dielectric material does not contain any pore filing material. In the meanwhile, by selectively filling pores of a portion of the dielectric material layer 30 that is located in the crack stop region 200, the mechanical strength of the portion of the dielectric material layer 30 in the crack stop region 200 is greatly improved. The crack prorogation can thus be stopped within the crack stop region 200 and prevented from propagating into the chip region 100.

Figure 4:
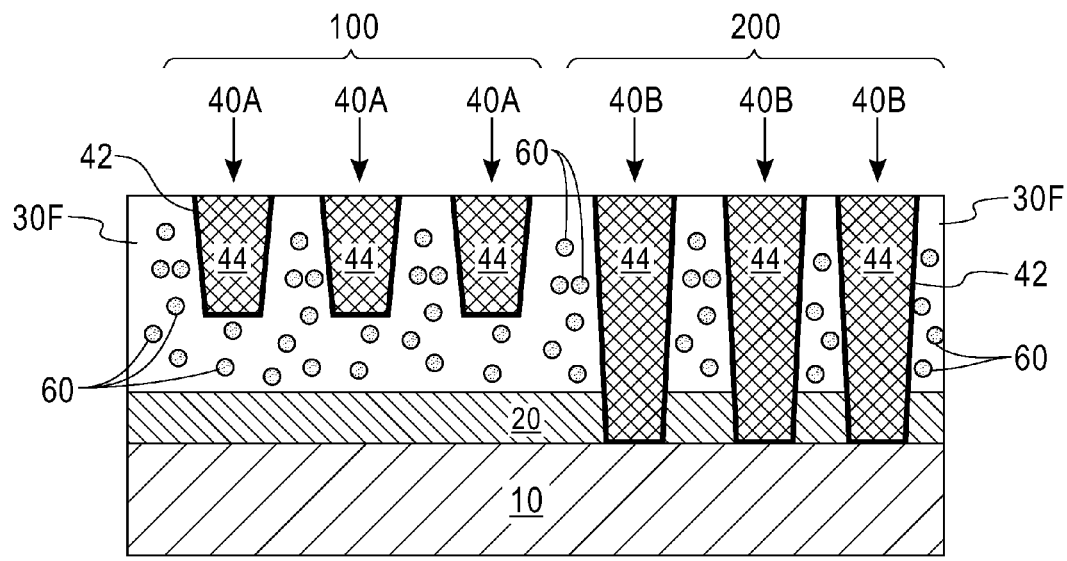
FIG. 4 is a cross-sectional view of a second exemplary semiconductor structure that can be derived from the first exemplary semiconductor structure of FIG. 1 after filling pores of an entire dielectric material layer with a pore filling material in accordance with a second embodiment of the present application.

Referring to FIG. 4, a second exemplary semiconductor structure according to a second embodiment of the present application can be derived from the first exemplary semiconductor structure of FIG. 1 by introducing a pore filling material 60 into the entire dielectric material layer 30. The pore filling material 60 can be introduced into the dielectric material layer 30 by performing the processing steps of FIG. 3 to provide a filled dielectric material layer 30F. In the second embodiment, pores of the dielectric material layer 30 in both the chip region 100 and the crack stop region 200 are filled by the pore filling material 60. The pore filling material 60 may include a decomposable polymer that can be completely decomposed and/or extracted under irradiation, plasma, microwave, increased temperature or a combination thereof. In one embodiment, the pore filling material 60 includes a radiation decomposable polymer that decomposes upon exposure to radiation e.g., ultraviolet (UV), x-ray, electron beam or the like. Exemplary decomposable polymers include, but are not limited to, polyethers such as polypropylene oxide, polyacrylates such as poly(methyl methacrylate), aliphatic polycarbonates such as polypropylene carbonate and polyethylene carbonate, polyesters, polysulfones and polystyrenes such as poly (α-methyl styrene).

Figure 5:
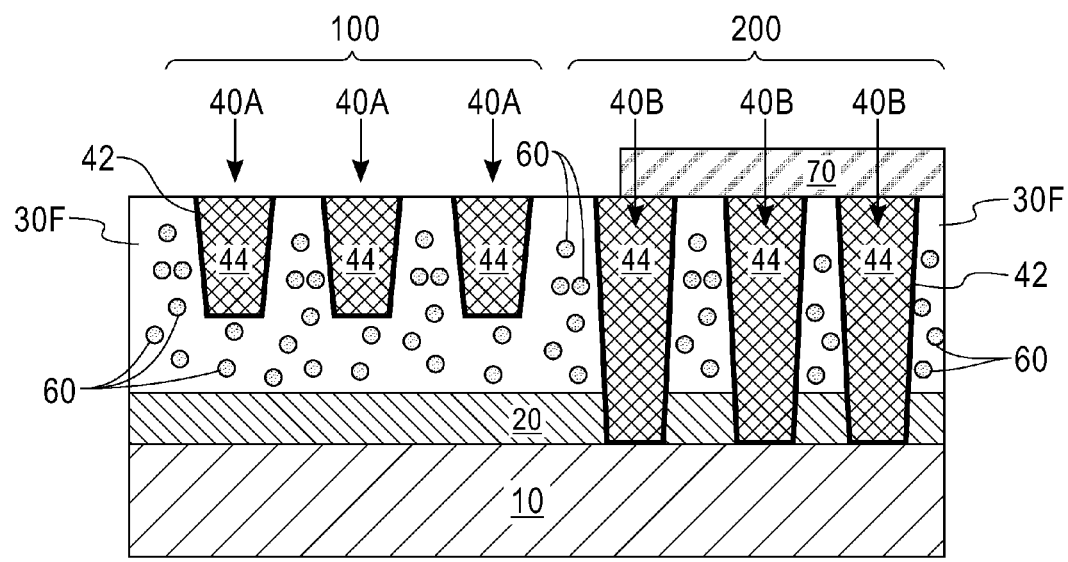
FIG. 5 is a cross-sectional view of the second exemplary semiconductor structure of FIG. 4 after forming a second mask layer portion covering a portion of the dielectric material layer and a second set of interconnect structures in a crack stop region, while exposing another portion of the dielectric material layer and a first set of interconnect structures in a chip region that is surrounded by the crack stop region.

Referring to FIG. 5, a second mask layer portion 70 is formed covering the crack stop region 200, while exposing the chip region 100. The second mask layer portion 70 can be formed by performing the processing steps of FIG. 2. For example, a second mask layer (not shown) is first formed as a blanket layer over the top surface of the dielectric material layer 30 and the top surfaces of the first and second interconnects 40A, 40B. The second mask layer can be a photoresist layer or a photoresist layer in conjunction with a hardmask layer(s). The second mask layer is subsequently patterned by an anisotropic etch to provide the second mask layer portion 70 which is a remaining portion of the second mask layer. The anisotropic etch can be a dry etch such as, for example, RIE or a wet etch that removes materials that provide the second mask layer selective to the dielectric material that provides the dielectric material layer 30, the metals that provide the metal liners 42 and the metal portions 44 and the pore filling material 60.

Figure 6:
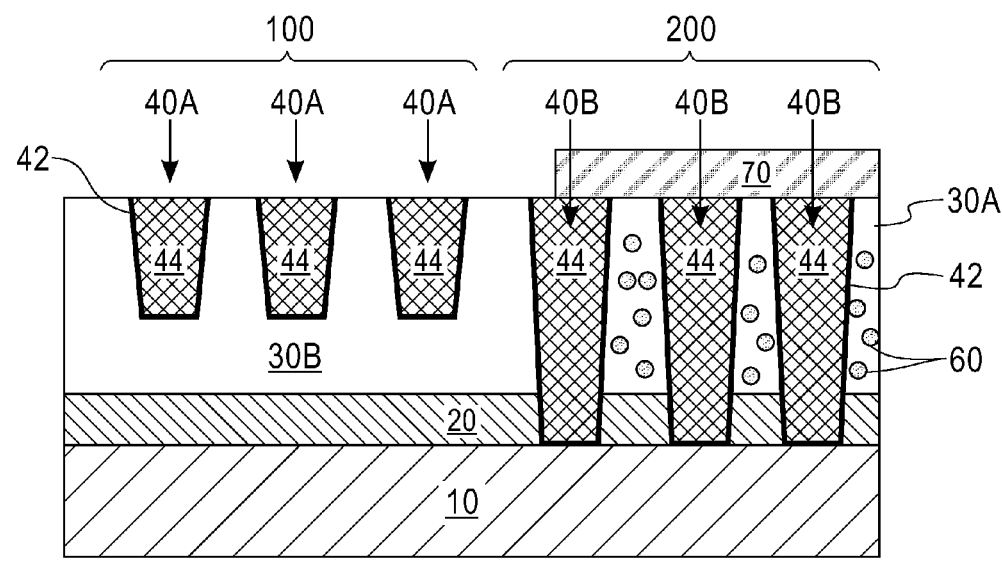
FIG. 6 is a cross-sectional view of the second exemplary semiconductor structure of FIG. 5 after removing the pore filling material from the exposed portion of the dielectric layer in the chip region.

Referring to FIG. 6, the pore filling material 60 in the chip region 100 that is not covered by the second mask layer portion 70 is removed from pores of the filled dielectric material layer 30F. In one embodiment, the pore filling material 60 is removed, for example, by exposing the structure to an UV irradiation. The pore filling material 60 in the chip region 100 is decomposed to volatile fragments that diffuse out of the filled dielectric material layer 30F. The exposed portion of the filled dielectric material layer 30F in the chip region 100 is thus reverted back to its porous form. After selective removal of the pore filling material 60 from the chip region 100, the pristine dielectric material portion thus formed in the chip region 100 is herein referred to as a dielectric material portion 30B. The low-k characteristics of the dielectric material portion 30B provides desirable capacitance between the first interconnect structures 40A in the chip region 100. The remaining portion of the filled dielectric material layer 30F in the crack stop region 200 is herein referred to as the filled dielectric material portion 30A. The filled dielectric material portion 30B is mechanically stronger than the dielectric material portion 30A, thus is more effective in preventing or reducing the crack propagation.

After removing the pore filling material 60 selectively from the chip region 100, the second mask layer portion 70 may be removed by oxygen-based or $N_2/H_2$-based plasma etch or it may be retained.

Subsequently, upper level metallization layers of a BEOL structure may be constructed by performing the processing steps described above in FIGS. 4-6.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a plurality of interconnect structures embedded in a dielectric material layer located over a substrate, the plurality of the interconnect structures comprising a first set of interconnect structures located in a chip region and a second set of interconnect structures located in a crack stop region around a periphery of the chip region; and
    filling at least some pores in a portion of the dielectric material layer located in the crack stop region with a pore filling material,
    wherein the filling the at least some pores in the portion of the dielectric material layer located in the crack stop region with the pore filling material comprises:
        forming a mask layer portion over the dielectric material layer to cover the chip region, while exposing the crack stop region,
        applying the pore filling material over the mask layer portion, the exposed portion of the dielectric material layer and the second set of interconnect structures, and
        diffusing the pore filling material into the at least some pores of the exposed portion of the dielectric material layer.

2. The method of claim 1, further comprising heating the pore filling material to a temperature above a glass transition temperature of the pore filling material to promote the diffusion of the pore filling material.

3. The method of claim 2, further comprising removing excess pore filling material from top surfaces of the mask layer portion, the exposed portion of the dielectric material layer and the second set of interconnect structures after the diffusion of the pore filling material.

4. The method of claim 3, wherein the removal of the excess pore filling material comprises plasma etch, reactive ion etch, wet dissolution or polishing.

5. The method of claim 3, further comprising removing the mask layer portion after the removal of the excess pore filling material.

6. A method of forming a semiconductor structure comprising:
    forming a plurality of interconnect structures embedded in a dielectric material layer located over a substrate, the plurality of the interconnect structures comprising a first set of interconnect structures located in a chip region and a second set of interconnect structures located in a crack stop region around a periphery of the chip region; and
    filling at least some pores in a portion of the dielectric material layer located in the crack stop region with a pore filling material,
    wherein the filling the at least some pores in the portion of the dielectric material layer located in the crack stop region with the pore filling material comprises:
        applying the pore filling material over the dielectric material layer and the plurality of interconnect structures,
        diffusing the pore filling material into the at least some pores of the dielectric material layer,
        forming a mask layer portion over the dielectric material layer to cover the crack stop region, while exposing the chip region, and
        removing the pore filling material from a portion of the dielectric material layer located in the chip region.

7. The method of claim 6, further comprising heating the pore filling material to a temperature above a glass transition temperature of the pore filling material to promote the diffusion of the pore filling material.

8. The method of claim 6, further comprising removing excess pore filling material from top surfaces of the dielectric material layer and the plurality of interconnect structures after the diffusion of the pore filling material.

9. The method of claim 8, wherein the removal of the excess pore filling material comprises plasma etch, reactive ion etch, wet dissolution or gentle polishing.

10. The method of claim 6, wherein the removing the pore filling material from the portion of the dielectric material layer located in the chip region comprises:

forming a mask layer portion over the dielectric material layer to cover the crack stop region, while exposing the chip region; and decomposing the pore filling material exposed in the chip region.

11. The method of claim 10, wherein the pore filling material is decomposed under irradiation, plasma, microwave, increased temperature or a combination thereof.

* * * * *